United States Patent [19]

Bumann et al.

[11] Patent Number: 4,544,003
[45] Date of Patent: Oct. 1, 1985

[54] TERMINAL STRAIGHTENER FOR AN INTEGRATED CIRCUIT PACKAGE

[75] Inventors: Richard L. Bumann, Olivenhain; Patrick G. Chipman, San Diego, both of Calif.

[73] Assignee: Burroughs Corporation, Detroit, Mich.

[21] Appl. No.: 627,120

[22] Filed: Jul. 2, 1984

[51] Int. Cl.⁴ .............................................. B21F 1/02
[52] U.S. Cl. .................................................. 140/147
[58] Field of Search ................. 140/147; 29/739, 741, 29/835, 838

[56] References Cited

U.S. PATENT DOCUMENTS 3,779,291  12/1973  Yeo ..................................... 140/147

Primary Examiner—Francis S. Husar
Assistant Examiner—Linda McLaughlin
Attorney, Agent, or Firm—Charles J. Fassbender; Kevin R. Peterson

[57] ABSTRACT

A mechanism for straightening bent terminals on an integrated circuit package comprises a base having a pair of spaced apart arms pivotally coupled thereto. Rollers attach to the arms to support and move a plate when the arms are pivoted. The plate has a first set of holes which are tapered to accept bent terminals and to straighten them when they are forced into the taper. A plurality of pins extend from the base between the arms and stop parallel to the plate. The plate has a second set of holes through which the pins move when the arms are pivoted. A plurality of intermeshed gears couple to the base and the arms to pivot the arms in synchronization and move the plate perpendicular to the pins which push the integrated circuit package straight out of the first set of holes.

12 Claims, 8 Drawing Figures

TERMINAL STRAIGHTENER FOR AN INTEGRATED CIRCUIT PACKAGE

BACKGROUND OF THE INVENTION

This invention relates to mechanisms which aid in inserting integrated circuit packages (IC packages) into the holes of a printed circuit board; and more particularly, it relates to mechanisms for straightening the terminals of pin grid array IC packages prior to their insertion.

In the manufacture of integrated circuits, a semiconductor wafer is processed by various steps that have been described in the art in order to produce a plurality of identical circuits on the wafer. After this processing is complete, the circuits are cut from the wafer and are individually mounted in respective IC packages that are generally made from plastic or ceramic.

One of the functions of an IC package is to provide a means for coupling the integrated circuit to printed wiring on a printed circuit board. To that end, each package contains a plurality of input/output terminals. These terminals are connected by conductors within the package to microscopic bonding pads on the integrated circuit die. Since the terminals are much larger and stronger than the bonding pads on the integrated circuit die, they are more suitable than the bonding pads themselves for making connections to the printed circuit board.

Over the past several years, the trend in IC packaging technology has been to increase the number of terminals on an IC package. A few years ago, standard packages contained just sixteen input/output terminals; whereas today, the number of terminals may exceed one hundred. Also, these terminals become bent and misaligned due to handling. This presents the problem of how to insert such a large number of terminals into a printed circuit board.

Prior art packages having only sixteen terminals were rectangular in shape, and eight terminals were located on one side of the package while the remaining terminals were located on the other side. Thus, all of the terminals could be manipulated by one's fingers as the terminals were being inserted into the holes of a printed circuit board. If some of the terminals did not align with their respective holes, one would merely push on them with his fingers to align the terminals during the insertion process.

However, when the number of terminals on an IC package gets substantially larger (i.e., exceeds fifty), it is impractical to place half of the terminals on one side of the package and half on the other because the length of the package becomes too long. Instead, the terminals are made to extend from the package in a grid-like array. This is called a pin grid array package.

In such a package, the array is square-shaped, and it has at least two rows of terminals on each of the four sides. Also, the terminals are generally quite close together (e.g., less than 0.125 inches). Thus, the outer row of terminals blocks access to all of the terminals on all of the inner rows. This makes it impossible to manipulate the inner row terminals with one's fingers, and difficult at best to manipulate them with mechanical tools while the package is being inserted into the holes of a printed circuit board. Even if just a few of the terminals are slightly bent and misaligned with their respective holes, the insertion process is a tedious, time-consuming job.

Accordingly, a primary object of the invention is to provide a means for straightening all of the terminals of a pin grid array IC package prior to their insertion into a printed circuit board.

BRIEF SUMMARY OF THE INVENTION

In one embodiment of the invention, the above object, and others, are by a mechanism which has a base and a pair of spaced apart arms pivotally coupled thereto. Rollers attach to the arms to support and move a plate when the arms are pivoted. The plate has a first set of holes which are tapered to accept bent terminals and to straighten them when they are forced into the taper. A plurality of pins extend from the base between the arms and stop parallel to the plate. The plate has a second set of holes through which the pins move when the arms are pivoted. A plurality of intermeshed gears couple to the base and the arms to pivot the arms in synchronization and move the plate perpendicular to the pins which push the integrated circuit package straight out of the first set of holes.

BRIEF DESCRIPTION OF THE DRAWINGS

Various features and advantages of the invention are described in the Detailed Description in conjunction with the accompanying drawings wherein.

DETAILED DESCRIPTION OF THE INVENTION

Figure 1:
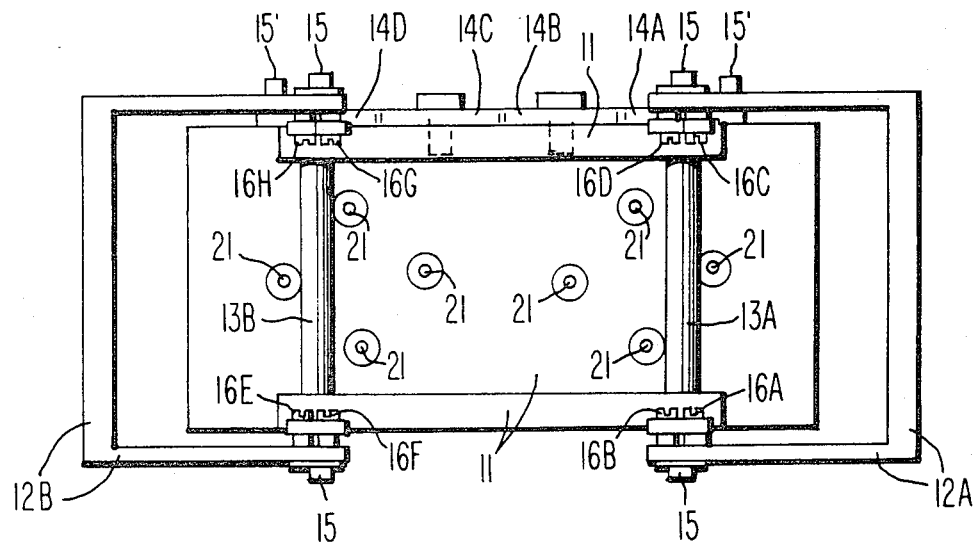
FIG. 1 is a top view of one preferred embodiment of the invention.
Figure 2:
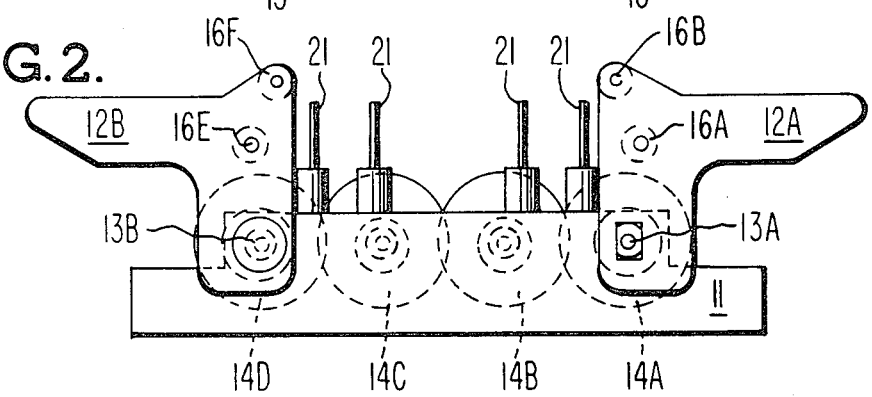
FIG. 2 is a side view of the embodiment of FIG. 1.
Figure 3:
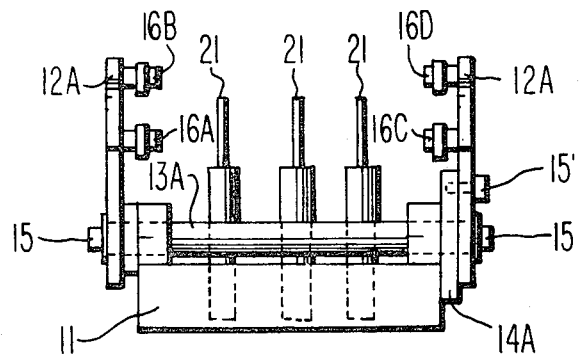
FIG. 3 is a right end view of the embodiment of FIG. 1.
Figure 4:
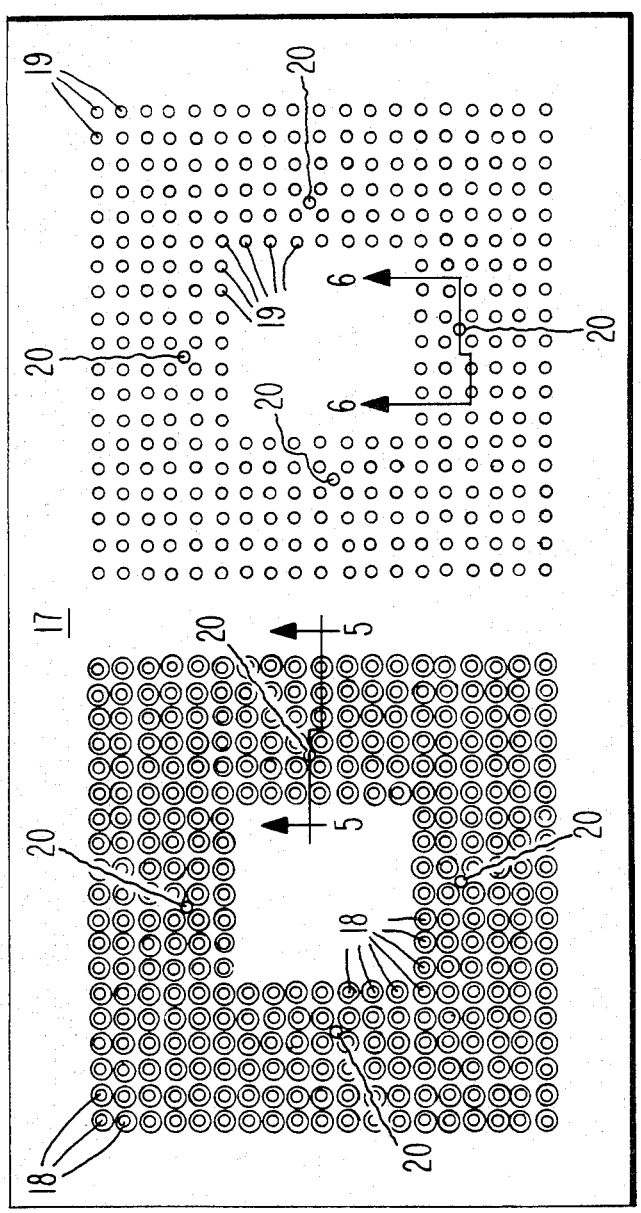
FIG. 4 is a top view of a plate that fits between rollers 16a–16h in the embodiment of FIG. 1.
Figure 5:
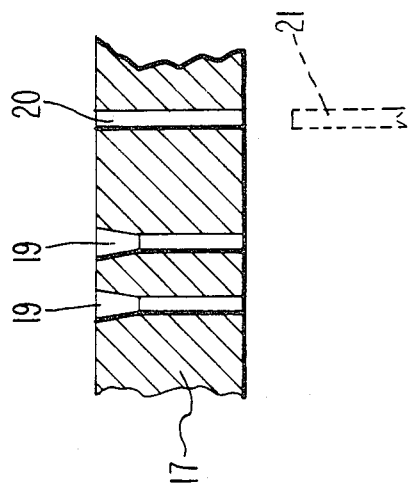
FIG. 5 is an enlarged cross-sectional view taken along lines 5—5 in FIG. 4.
Figure 6:
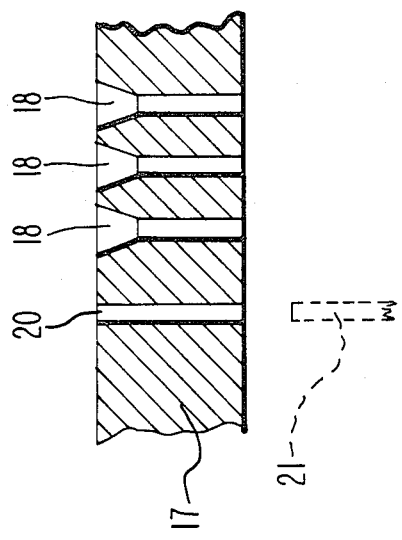
FIG. 6 is an enlarged cross-sectional view taken along lines 6—6 in FIG. 4.

With reference now to all of the figures, one preferred embodiment of the invention will be described in detail. This embodiment includes a base 11 to which a pair of spaced apart arms 12a and 12b are pivotally attached. In the illustrated embodiment, a pair of shafts 13a and 13b pass through holes in base 11; and arms 12a and 12b attach to shafts 13a and 13b respectively.

Each shaft has a cylindrical shape except for its ends which are flattened. Arm 12a has a pair of rectangular holes into which the flattened ends of shaft 13a fit. Similarly, arm 12b has a pair of rectangular holes into which the flattened ends of shaft 13b fit.

Arms 12a and 12b are coupled together by four spur gears 14a, 14b, 14c, and 14d. Gear 14a fits on shaft 13a between arm 12a and base 11; gear 14d fits onto shaft 13b between arm 12b and base 11; and gears 14b and 14c screw into base 11 between gears 14a and 14d.

Each end of shaft 13a has a washer and a screw 15 which holds arm 12a and gear 14a in place. Another screw 15' locks gear 14a to arm 12a so that they move together. Additional screws 15 and 15' are similarly disposed on shaft 13b, arm 12b, and gear 14d.

Four roller bearings 16a, 16b, 16c, and 16d screw into arm 12a; and four other roller bearings 16e, 16f, 16g, and 16h screw into arm 12b. These roller bearings support a flat rectangular plate 17. Bearings 16a, 16c, 16e, and 16g lie in one plane, and plate 17 lies on them. Bearings 16b, 16d, 16f, and 16h lie in another plane that is parallel to and over plate 17.

In one version of the above embodiment, base 11 is 5 inches long, 2½ inches wide, and 1 inch high; arms 12a and 12b are 1¾ inches high and 2 inches long; gears 14a thru 14d are 1 inch in diameter; and plate 17 is 4¾ inches long, 2½ inches wide, and ¼ inch thick. All of these components are made of metal (e.g., aluminum) except for plate 17 which is made of plastic (e.g., nylon).

Plate 17 has three sets of holes 18, 19, and 20. All of the holes 18 and all of the holes 19 are arranged in an identical grid-like pattern. This pattern is nineteen holes by nineteen holes on the outside, is six rows deep, and is nine holes by nine holes on the inside. Various subsets of these holes correspond to the terminal pattern on several different packages.

Specific match-ups between the terminals of a pin grid array package and the holes 18 (or 19) are as follows. A seventy-three terminal package fits into the two smallest inside rows. An eighty-nine terminal package fits into the two inside rows after the smallest row. A one hundred forty-four terminal package fits into the three inside rows after the smallest row. And a two hundred nine terminal package fits into the four middle rows.

All of the holes 18 have a tapered upper portion and a cylindrical lower portion. Due to the tapering, the terminals of an integrated circuit package can be placed into the holes even when the terminals are bent. Then the bent terminals can be straightened by pushing on the package to move the terminals along the taper and into the cylindrical portion of the holes.

Preferably, the sidewalls of the taper make an angle of less than 30° with the axis of the holes. Such a steep taper reduces the frictional force that must be overcome in order to push the IC package terminals into the holes, and it reduces wear on the tips of the terminals. This in turn enables an IC package with a large number of terminals to be easily pushed by hand into the holes 18 without scraping any conductive coating (such as gold plating) from the terminals.

All of the holes 19 are arranged in the same pattern as the holes 18; and they are also tapered like the holes 18. However, the holes 19 are smaller than the holes 18. This enables the terminals of an IC package to be coarsely straightened via the holes 18 and then finely straightened via the holes 19.

In one specific embodiment, holes 18 and 19 respectively have a large diameter of 0.075 inches and 0.045 inches; and holes 18 and 19 respectively have a small diameter of 0.035 inches and 0.025 inches. All of the holes 18 and 19 are tapered to a depth of 0.075 inches; and they are spaced on 0.100 inch centers.

All of the holes 20 in plate 17 are interspersed among the holes 18 and 19. These holes 20 are cylindrical and untapered; and a plurality of pins 21 extend from base 11 and fit into the holes. All of the ends of the pins 21 lie in a plane that is parallel to plate 17.

To begin a terminal-staightening operation, arms 12a and 12b are pivoted upward away from base 11 until a position is reached where plate 17 wedges and jams between the rollers on the top and bottom of the plate. Such a jam occurs because the radii from the pivot to the rollers on the top of plate 17 are offset by an angle of 15° with the radii to the rollers on the bottom of the plate.

Figure 7:
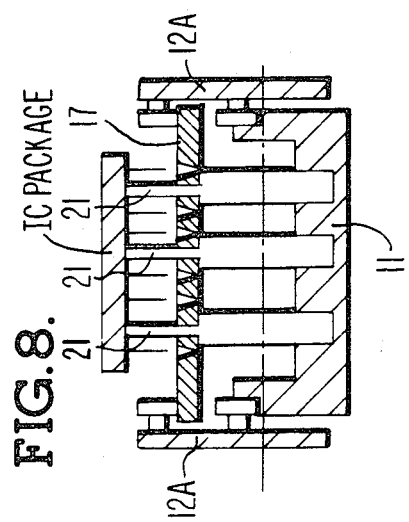
FIG. 7 is a schematic diagram illustrating the operation of the embodiments of FIGS. 1-6.

This jam is designed to occur when the rollers on the bottom of plate 17 are directly above the pivot point. Thus, when the bent terminals of an IC package are forced into the holes 18 by pushing on the top of the package, the arms 12a and 12b do not move. This operation is complete when the package reaches the position illustrated in FIG. 7.

Thereafter, to remove the IC package from the holes 18, the arms 12a and 12b are pivoted to move plate 17 towards base 11. This causes the pins 21 to move through the holes 20 and push against the IC package.

Due to the operation of the gears 14a thru 14d, plate 17 stays perpendicular to the pins 21 as it moves. That is, whenever arm 12a is pivoted by a certain angle, the gears pivot arm 12b by the same angle; and vice versa.

Figure 8:
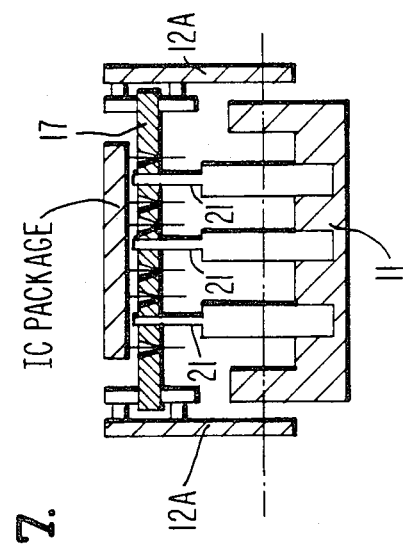
FIG. 8 is a schematic diagram further illustrating the operation of the embodiment of FIGS. 1-6.

Thus, when the arms turn, the ends of all of the pins 21 push in parallel against the IC package and thereby move the IC package terminals straight from the holes 18. This is illustrated in FIG. 8.

In an IC package, the circuit itself is in a cavity at the center of the package which is covered by a lid. This circuit and lid are not pushed on by the pins 21. Instead, the pins 21 push on the package between the surrounding terminals so that little or no mechanical stress is placed on the circuit.

Also, the arms 12a and 12b are L-shaped to provide a lever by which the arms are turned about their pivot point. Thus the IC package terminals are removed from the holes 18 with a mechanical advantage.

By comparison, to remove the integrated circuit package from plate 17 without bending the terminals by simply grabbing the package by its sides and pulling is extremely difficult. One reason is that the sides of the package are quite thin and so a large pressure must be exerted on the sides in order to sustain the required removal force.

A removal force of about five pounds is required to move an IC package from plate 17. But the height of an IC package is only about one-eighth inch, and the width of one's fingers is only about one-half inch. So the pressure that must be applied by one's fingers is (5 lbs) (⅛"×½"×2) or 40 psi.

Further, all of the terminals of the IC package are not all bent to the same degree. Thus, the removal force must be exerted unevenly across the package. Also, the distribution of the removal force across the package will change completely from one package to another.

After the terminals of the IC package are removed from the holes 18, they are inserted into the holes 19 to straighten them to a finer degree. Then the bent terminals of another IC package can be inserted into the holes 18 to coarsely straighten them. Thereafter the arms 12a and 12b are pivoted to remove both IC packages from the holes 18 and 19. Then the package that was in the holes 18 is inserted into the holes 19; another package is inserted into the holes 18; etc. These operations take only a few seconds and the terminals are straightened evenly every time.

A preferred embodiment of the invention has now been described in detail. In addition, however, various changes and modifications can be made to this embodiment without departing from the nature and spirit of the invention. Accordingly, it is to be understood that the invention is not limited to this one embodiment but is defined by the appended claims.

What is claimed is:

1. A mechanism for straightening bent terminals on an IC package, comprising:
    a base having a pair of spaced apart arms pivotally coupled thereto;
    said arms having rollers which support a plate and move said plate when said arms are pivoted;
    said plate having a first set of holes which are tapered to accept said bent terminals and to straighten them when they are forced into the taper;
    a plurality of pins between said arms that extend from said base and stop in a plane parallel to said plate;
    said plate having a second set of holes through which said pins move when said arms are pivoted to push on said IC package; and
    a plurality of intermeshed gears coupled to said base and said arms that synchronize the pivotal movement of said arms such that said package and plate move perpendicular to said pins and said terminals move straight out of said first set of holes.

2. A mechanism according to claim 1 wherein said first set of holes that have a wide taper to coarsely straighten said terminals and said plate further includes another set of holes that have a narrow taper to finely straighten said terminals after they are coarsely straightened.

3. A mechanism according to claim 1 wherein said rollers are spaced apart on each arm and said plate is held between them.

4. A mechanism according to claim 1 wherein said rollers are located on said arms both above and below said plate, and are offset at an angle such that they jam against said plate when said arms are pivoted to a position where the rollers on the bottom of said plate are directly above the point about which the arms pivot.

5. A mechanism according to claim 1 wherein at least one of said arms includes a lever for manually pivoting said arms to push said terminals out of said first set of holes with a mechanical advantage.

6. A mechanism according to claim 1 wherein the number of holes in said first set is at least fifty.

7. A mechanism for straightening bent terminals on an IC package, comprising:
    a base having a pair of spaced apart arms pivotally coupled thereto and a plurality of pins between said arms that extend from said base and stop in a plane;
    said arms having rollers which support a plate and move said plate parallel to said plane when said arms are pivoted;
    said plate having a set of holes with a wide taper to coarsely straighten said bent terminals when they are forced into the taper;
    said plate also having a set of holes with a narrow taper to finely straighten said terminals after they are coarsely straightened;
    said plate further having another set of holes through which said pins pass when said arms are pivoted to push against said IC package and remove said terminals from their holes; and a means coupled to said base and said arms that pivot said arms in synchronization and confine the motion of said plate to be perpendicular to said pins.

8. A mechanism according to claim 7 wherein said means is a plurality of intermeshed gears.

9. A mechanism according to claim 8 wherein said rollers are spaced apart on each arm and said plate is held between them.

10. A mechanism according to claim 9 wherein said rollers are located on said arms both above and below said plate, and are offset at an angle such that they jam against said plate when said arms are pivoted to a position where the rollers on the bottom of said plate are directly above the point about which the arms pivot.

11. A mechanism according to claim 10 wherein at least one of said arms includes a lever for manually pivoting said arms to push said terminals out of their holes with a mechanical advantage.

12. A mechanism according to claim 11 wherein each set of tapered holes includes at least fifty holes.

* * * * *